United States Patent [19]
White et al.

[11] Patent Number: 5,680,173
[45] Date of Patent: Oct. 21, 1997

[54] KINESCOPE DRIVER APPARATUS

[75] Inventors: Charles Michael White; Jeffery Basil Lendaro, both of Noblesville, Ind.

[73] Assignee: Thomson Consumer Electronics, Inc., Indianapolis, Ind.

[21] Appl. No.: 494,262

[22] Filed: Jun. 23, 1995

[51] Int. Cl.[6] ..................................................... H04N 5/68
[52] U.S. Cl. ............................ 348/380; 348/707; 315/387
[58] Field of Search ................................. 348/380, 707, 348/180, 177; 315/387, 388; 330/265, 348

[56] References Cited

U.S. PATENT DOCUMENTS

| | | | |
|---|---|---|---|
| 3,233,184 | 2/1966 | Wheatley, Jr. | 330/15 |
| 4,025,802 | 5/1977 | Inoue et al. | 307/350 |
| 4,079,336 | 3/1978 | Gross | 330/296 |
| 4,151,483 | 4/1979 | Robe | 330/308 |
| 4,293,875 | 10/1981 | Katz | 348/707 |
| 4,860,107 | 8/1989 | Furrey | 358/184 |
| 5,196,941 | 3/1993 | Altmanshofer | 348/707 |
| 5,337,092 | 8/1994 | Ogino et al. | 348/380 |
| 5,448,311 | 9/1995 | White et al. | 348/707 |
| 5,495,214 | 2/1996 | Malota | 348/707 |
| 5,546,048 | 8/1996 | Sano et al. | 348/707 |

FOREIGN PATENT DOCUMENTS 0335 607   10/1989   European Pat. Off. ......... H04N 5/68

OTHER PUBLICATIONS

Radio Fernsehen Electronik, vol. 42, No. 7, Jul. 1, 1993, pp. 47–49, Kuehne H., "Untersuchung des Brietband–OTA LT1228" (with translation).
Copy of European Search Report for Corresponding EPO Application.

*Primary Examiner*—Victor R. Kostak
*Attorney, Agent, or Firm*—Joseph S. Tripoli; Peter M. Emanuel; Richard G. Coalter

[57]   ABSTRACT

A complementary push-pull emitter follower amplifier is coupled between the output of a high voltage driver amplifier and the cathode of a kinescope for reducing the effective capacitance presented to the driver amplifier that is attributable to the kinescope cathode, socket, spark gaps and related stray capacitances. A secondary undesired capacitance loading of the amplifier attributable to the collector to base capacitances of the follower amplifier is effectively reduced by regulating the collector emitter voltages of the push-pull follower output transistors at respective substantially constant values thereby improving parameters such as the slew rate and bandwidth of the overall video display system.

20 Claims, 6 Drawing Sheets

KINESCOPE DRIVER APPARATUS

FIELD OF THE INVENTION

This invention relates to amplifiers generally and particularly to apparatus for providing amplification of a video signal for driving the cathode electrode of a kinescope.

BACKGROUND OF THE INVENTION

In television apparatus employing direct view or projection kinescopes as display devices, it is desirable that the amplifier which drives the kinescope cathode provide a relatively high voltage drive signal having a wide bandwidth and a high slew rate. Typically, drive voltages may be on the order of 200 volts or so, bandwidths may be 5 MHz or higher and slew rates may be substantially more than 100 volts/ micro-second.

To facilitate high voltage operation it is common to employ a cascode configuration of a common emitter input stage driving a common base output stage. Such a configuration requires only one high voltage transistor (the output stage) and since it is connected in a common base configuration the Miller effect is suppressed and very wide bandwidth operation is thus possible. In practice, the actual bandwidth and slew rate which may be achieved in a cascode amplifier depends, to a great extent, on the effective load capacitance presented to the output stage and the available output current.

In general one may either increase the amplifier operating current or decrease the effective load capacitance to maximize the bandwidth and slew rate of the amplifier. However, since increasing the current necessarily implies increasing the amplifier power dissipation, it is preferable to take steps to reduce the effective load capacitance for improved performance rather than resort to increases in operating power.

In kinescope driver applications, the "effective" load capacitance presented to the amplifier is principally that of the kinescope cathode and stray capacitances associated with the socket, spark gaps, wiring and the like. An effective approach to reducing the effective capacitance loading is to couple the amplifier to the cathode by means of a push-pull complementary emitter follower amplifier. Such an amplifier effectively "isolates" the load capacitance approximately in proportion to the reciprocal of the transistor current gain ("beta"). The additional current provided by the follower amplifier provides faster charging and discharging of the load capacitance and thus enhances slew rate and bandwidth. To avoid substantially increasing the quiescent power dissipation, it is customary practice to operate the follower amplifier in a "class-B" mode in which the push-pull transistors are biased to avoid simultaneous conduction.

It has been recognized by John H. Furrey, in U.S. Pat. No. 4,860,107 entitled VIDEO DISPLAY DRIVER APPARATUS which issued 22 Aug., 1989, that one may obtain improved capacitance reduction by use of a "series form" of push-pull complementary emitter follower rather than the more ordinary "parallel form" of push-pull complementary emitter follower and Furrey developed such an amplifier having the desired class-B conduction operation.

In more detail, by definition as used herein a "parallel form" of complementary emitter (or source) follower is one in which the inputs (base or gate electrodes) of a pair of complementary transistors (bipolar or field effect) are connected in parallel for receiving an input signal from an amplifier and the outputs (emitters or sources) are connected in parallel for driving a load. The term "series form" of complementary emitter or source follower is one in which the complementary emitter (or source) followers are connected in series to form a cascade connection between the output of an amplifier and a load and which includes diodes for by-passing the series transistor that is not driving the load.

In the Furrey series form of complementary "push-pull" emitter follower, diodes are provided for each transistor to by-pass the transistor that is biased off. Specifically, a diode is connected across the base emitter junction of each transistor and each diode is poled for forward current conduction in a direction opposite to that of the associated base emitter junction. This significantly reduces the effective load capacitance of the display (kinescope load and stray capacitances) thereby improving positive and negative video signal transient response.

SUMMARY OF THE INVENTION

The use of complementary push-pull emitter follower (or, more generally, "voltage follower") amplifiers as described is effective in decreasing the capacitance presented to the driver amplifier attributable to the capacitance associated with the kinescope cathode. However, it is herein recognized that still further improvement in the driver amplifier performance may be obtained when using either type (i.e., the "series" type or the "parallel" type) of push-pull complementary emitter follower amplifier for coupling the output of the driver to the cathode electrode load. The present invention is directed to meeting this need. Also, the principles of the invention may be extended to single-ended driver applications as will be explained.

Kinescope driver apparatus embodying the invention comprises a video amplifier having an output coupled to a kinescope cathode electrode via a voltage follower. The voltage follower comprises a transistor having a conduction path and a control electrode for controlling the conduction of the path, the control electrode being coupled to receive a video signal from the video amplifier, a first end of the conduction path being coupled to a point of reference potential via a current source and being coupled to the kinescope cathode, the second end of the conduction path being coupled to a source of supply voltage. A feedback circuit is provided for applying a positive feedback voltage to the second end of the conduction path of the voltage follower transistor for maintaining a substantially constant voltage across the conduction path, the substantially constant voltage being independent of variations in the video signal applied to the control electrode.

BRIEF DESCRIPTION OF THE DRAWING

The foregoing and further features of the invention are illustrated in the accompanying drawing in which.

DETAILED DESCRIPTION

Figure 1:
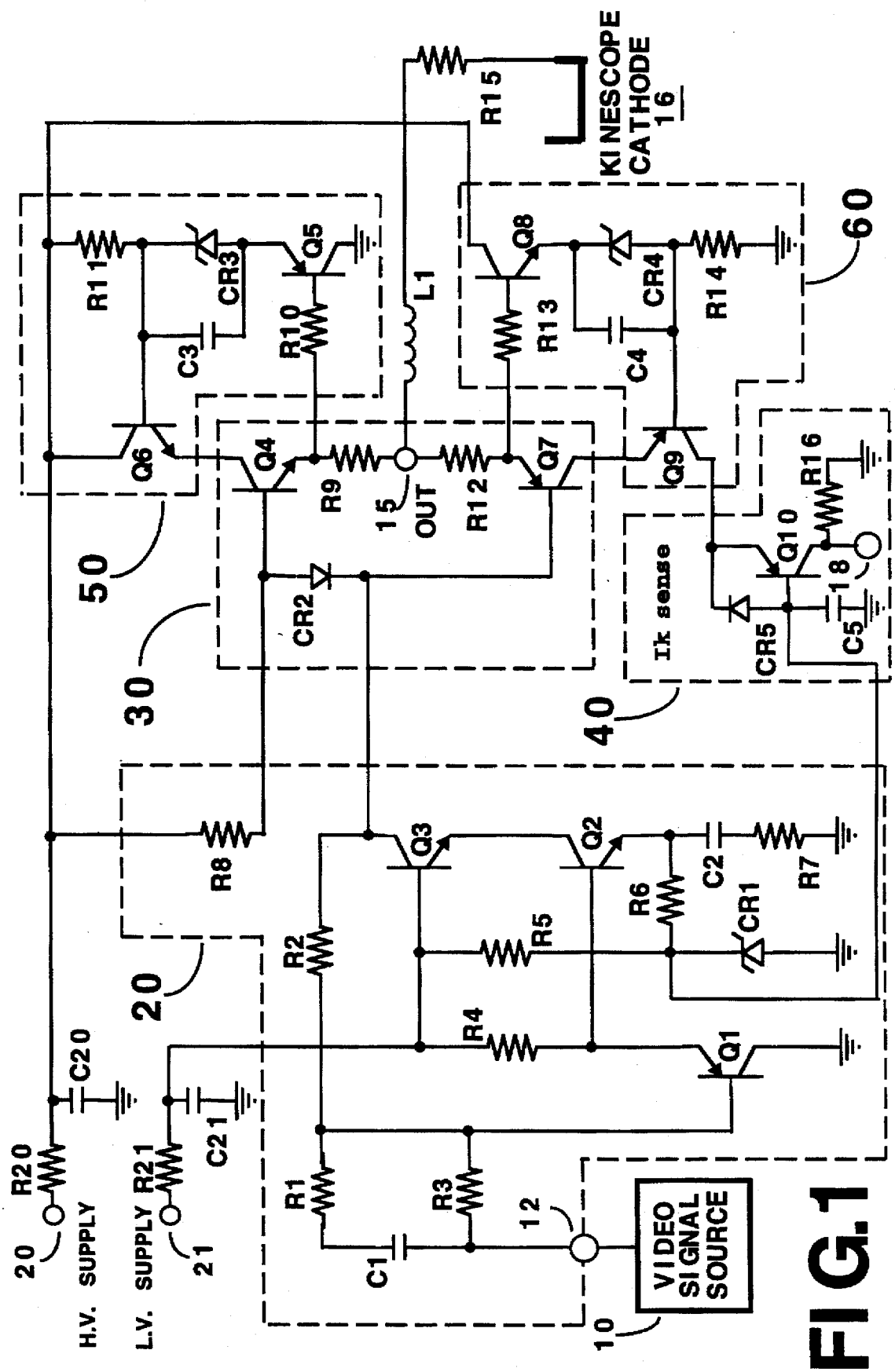
FIG. 1 is a schematic diagram, partially in block form, of a television display apparatus embodying the invention.

Before considering the details of the television system of FIG. 1, it is helpful first to consider in more detail the problem of using conventional push-pull emitter follower buffer amplifiers for isolating the kinescope cathode capacitance from the output of the kinescope driver amplifier. As previously explained, the use of a follower amplifier is effective in reducing the capacitance attributable to the cathode (and associated strays) that is presented to the output of the high voltage video driver amplifier. However, it is herein recognized that the follower amplifier itself may introduce a capacitance loading effect on the driver amplifier and this will tend to limit the overall system performance.

In more detail, it has been found that the main source of the undesirable capacitance loading effects in kinescope driver systems of the type using push-pull followers is attributable to the collector to base capacitances of the follower output transistors. Typically, these capacitances are smaller than the kinescope cathode capacitance and so isolating the cathode by a follower amplifier does provide an overall capacitance reduction and an improvement in slew rate and bandwidth as compared with direct coupled systems. However, to achieve the maximum benefit from the use of emitter follower isolation, it is herein recognized as being desirable to reduce the effective capacitance of the follower amplifier itself.

To achieve an effective reduction in follower capacitance, in accordance with the present invention, feedback is used in such a manner as to reduce the flow of current under dynamic signal conditions in the collector to base capacitances of the follower transistors. This is achieved, as will be explained in more detail later, by applying the feedback in such as manner as to maintain a substantially constant collector to emitter voltage for the follower transistors. This, in turn, tends to maintain the collector to base voltage constant. As a result, under dynamic signal conditions there will be little or no charging or discharging of the collector to base capacitances as the signal voltage varies.

The effective reduction in follower input capacitance attributable to the transistor collector to base capacitances is a function of the percentage of feedback applied to regulating the collector to emitter voltage. If, for example, the feedback percentage is selected such that collector to emitter voltage variations are reduced by fifty percent, then the reactive currents charging and discharging the collector to base capacitances of the follower amplifier will be also reduced by fifty percent and so the "effective" capacitance loading will be cut in half. Greater reductions in follower capacitance may be achieved as the feedback percentage is increased towards unity. In the examples of the invention which follow the percentage of positive feedback applied approaches one hundred percent. For purposes of circuit stability, provisions are made to ensure that the feedback gain can not equal or exceed unity. In the illustrated examples, this is achieved by connecting all "active" semiconductor devices in the feedback paths in voltage or "emitter" follower configurations.

The foregoing overview of the principles of the invention will now be discussed in detail with respect to the example of FIG. 1 which illustrates a television display system including a video signal source 10 for supplying a video signal S1 to a kinescope cathode 16 for display. To simplify the drawing, the details of the kinescope and the signal source are not shown. It will be appreciated that for a color system there would be three driver amplifiers.

As an overview, to amplify the video signal to the high voltage levels required at cathode 16 the system includes a cascode type of high voltage amplifier 20 (outlined in phantom). To isolate the output of the high voltage amplifier 20 from the capacitance of the kinescope cathode 16 the output of amplifier 20 (collector of transistor Q3) is coupled to cathode 16 via a push pull complementary emitter follower amplifier 30 (outlined in phantom). To protect the driver amplifier from kinescope arcs, the follower output terminal 15 is coupled to the cathode 16 by means of a kinescope arc protection resistor R15 and inductor L1. To provide for automatic kinescope bias (AKB) operation, a cathode current sensing circuit 40 ("Ik sense", outlined in phantom) is provided which senses the collector current of a PNP transistor (Q7) in the push-pull emitter follower amplifier 30 to generate an AKB output signal at an output terminal 18 proportional to the cathode current, Ik, of the kinescope cathode 16. This feature is optional and may be omitted as discussed later.

Finally, to reduce the effective capacitance presented to the high voltage amplifier which is attributable to the collector to base capacitances of the complementary emitter follower 30, the system includes a feedback control circuit 50 (outlined in phantom) which maintains a substantially constant collector emitter voltage for the NPN transistor Q4 of the follower 30 and another feedback control circuit 60 (outlined in phantom) which maintains a substantially constant collector emitter voltage for the PNP transistor Q7 of follower 30. As previously noted, and explained in more detail later, the operation of the follower transistors at constant values of collector to emitter voltage tends also to regulate the collector to base voltage at a nearly constant value and this, in turn, tends to reduce the magnitude of the charging and discharging currents of the collector to base capacitances of the follower transistors. The beneficial result is that, since the driver amplifier 20 does not have to supply charging and discharging currents for these "parasitic" capacitances, the overall slew rate, bandwidth and transient response characteristics are improved.

Consideration will now be given to circuit details and further operational features of the video display system of FIG. 1. The signal source 10 may be of conventional design including a tuner, IF amplifier and video detector as well as baseband processing providing hue and saturation control, brightness and contrast control and matrixing to component (e.g., RGB) for display. The kinescope may be of monochrome form or it may be of the color type (direct view or projection). For such color video applications three of the kinescope driver systems will be needed, one for each cathode to be driven. High voltage power (e.g., 200 volts or so) for operation of the amplifier 20 and the feedback or regulator circuits 50 and 60 is provided by high voltage (H.V.) supply terminal 20. Decoupling of the high voltage supply (20) is provided by a decoupling network or low pass filter comprising resistor R20 and capacitor C20. A low voltage (L.V.) supply terminal 21 provides a relatively low voltage (e.g., 12 volts or so) for biasing the input and cascode stages (transistors Q1–Q3) of the high voltage video driver amplifier 20. This supply input is also decoupled by means of an RC network comprising resistor R21 and capacitor C21.

The high voltage driver amplifier 20 comprises an NPN common emitter connected input transistor Q2 connected in cascode with a common base connected NPN output transistor Q3. A fixed base bias voltage for the cascode output transistor Q3 is provided by the low voltage (e.g., +12 volts) decoupling network (R21, C21). A lower potential for operation of the emitter load resistor R6 of the input transistor Q2 is provided by a Zener diode regulator comprising resistor R5 and Zener diode CR1 coupled between the base of transistor Q3 and ground. Illustratively, the Zener voltage may be 5 or 6 volts which establishes a DC reference for the load resistor R6 of the cascode input transistor as well as a DC reference for the AKB sense amplifier 40. The emitter electrode of the input transistor Q2 is also coupled to ground via a high frequency peaking network comprising resistor R7 and capacitor C2 which are coupled in series.

The video input signal to be amplified, provided by source 10, is applied to the base of the cascode input transistor via an emitter follower input stage comprising PNP transistor Q1 which is connected at the collector thereof to ground and coupled at the base thereof to the video input terminal 12 via an input resistor R3. The emitter of transistor Q1 is coupled to the base of transistor Q2 and to the low voltage supply 21 via an emitter resistor R4. Additional high frequency peaking is provided by a further peaking network comprising series connected resistor R1 and capacitor C1 coupled in parallel with the input resistor R3.

The collector load for the cascade amplifier 20 is provided by resistor R8 which is coupled from the high voltage supply 10 to the collector of the cascode output transistor Q3. A diode CR3 is interposed between the load resistor R8 and the collector of transistor Q3 to provided a small offset voltage for reducing cross-over distortion in the complementary emitter follower amplifier 30.

In operation of the cascode amplifier 20, the open loop gain is directly proportional to the value of the load resistor R8 and inversely proportional to the impedance of the emitter network R6, C2 and R7 as previously discussed. The open loop gain, bandwidth and slew rate is also a function of the capacitive loading of the output of amplifier 20 (i.e., the capacitance presented to the collector of transistor Q3). This is reduced, as explained in detail later, by operating the push-pull transistors of the complementary emitter follower amplifier 30 at constant values of collector to emitter voltage. The closed loop gain, assuming that the open loop gain is adequate, is directly proportional to the value of the feedback resistor R2 and inversely proportional to the impedance of the input network R1, R3 and C1.

Considering now the details of the push-pull complementary emitter follower amplifier 30, this amplifier includes a pair of complementary transistors Q4 and Q7 coupled at the base electrodes thereof to the output (collector of Q3) of amplifier 20 and coupled at the emitters thereof to an output terminal 15 via respective emitter resistors R9 and R12. The output 15 of follower 30 is coupled, as previously noted, to the cathode 16 via a kinescope arc suppression network comprising the series connection of inductor L1 and resistor R15. Supply voltage (collector potentials) for the follower transistors Q4 and Q7 are provided by respective feedback circuits 50 and 60.

Circuit 50 provides the function of regulating the collector to emitter voltage of follower transistor Q4 at a fixed value. To this end the circuit 50 includes a voltage regulator transistor Q6 connected at the collector thereof to supply 20 and at the emitter thereof to the collector of transistor Q4. The input (base) of the voltage regulator transistor Q6 is coupled to the emitter electrode of the follower transistor Q4 via a capacitor C3 in parallel with a threshold conduction device (i.e., a Zener diode) CR3. This positive feedback path establishes a substantially constant collector to emitter offset voltage for follower transistor Q4 equal to the Zener voltage. To provide an operating current for the Zener diode, the cathode thereof is coupled to the high voltage source 20 via a resistor R11. To minimize loading of the emitter circuit of transistor Q4, the emitter is coupled to the capacitor C3 and Zener diode CR3 via an emitter follower transistor Q5. Specifically, transistor Q5 is a PNP transistor coupled at the base thereof to the emitter of the follower transistor Q4 via a resistor R10. The collector-emitter path of follower transistor Q5 is coupled between the junction of capacitor C3 and Zener diode CR3 and ground. In certain applications transistor Q5 may be omitted as will be shown and described in a later example of the invention.

Circuit 60 is similar to circuit 50 and provides the function of regulating the collector to emitter voltage of follower transistor Q7 at a fixed value. To this end the circuit 60 includes a voltage regulator transistor Q9 connected at the collector thereof to a supply input of the sense amplifier 40 and at the emitter thereof to the collector of transistor Q7. The input of the voltage regulator transistor Q9 is coupled to the emitter electrode of the follower transistor Q7 via a capacitor C4 in parallel with a threshold conduction device (i.e., a Zener diode) CR4. This feedback path regulates the collector emitter voltage of the follower transistor Q7 at the Zener voltage. To provide an operating current for the Zener diode, the anode thereof is coupled to ground via a resistor R14. To minimize loading of the emitter circuit of transistor Q7, the emitter is coupled to the capacitor C4 and Zener diode CR4 via an emitter follower transistor Q8. Specifically, transistor Q8 is a NPN transistor coupled at the base thereof to the emitter of the follower transistor Q7 via a resistor R13. The collector-emitter path of transistor Q8 is coupled between the junction of capacitor C4 and Zener diode CR4 and the high voltage supply 20.

The sense amplifier 40 is provided for use in video display systems of the type featuring automatic kinescope bias (AKB) circuitry and thus requires sensing of the kinescope cathode current "Ik". Amplifier 40 comprises a cathode current sensing transistor Q10 connected at the emitter thereof to the collector of the voltage regulator transistor Q9. A reference potential for the base of transistor Q10 is provided by the Zener diode CR1. Capacitor C5, in parallel with diode CR1 provides filtering of the regulated Zener voltage. An output voltage, proportional to the cathode current Ik is developed at output terminal 18 across the load resistor R16 coupled between the collector of transistor Q10 and ground. In applications not requiring AKB operation the sense amplifier may be omitted. If so, as shown in a later example, the collector of voltage regulator transistor Q9 should be coupled to ground or another suitable low voltage reference potential.

To summarize the operation described above, the cascode amplifier 20 amplifies the video signal provided by source 10 as previously described. To minimize the capacitive loading on load resistor R8 that is attributable to the capacitance associated with the kinescope 16, its socket and spark arrestors (not shown) and other stray capacitances, the output (collector of transistor Q3) of the cascade amplifier 20 is coupled to the kinescope cathode electrode via a push-pull complementary emitter follower amplifier 30. This particular follower amplifier is of the "parallel" type in which the base electrodes are in parallel for receiving the amplified video signal and the emitters are in parallel for driving the cathode.

The inclusion of the follower amplifier 30, as recognized herein, does provide a reduction in cathode capacitance presented to the amplifier 20 but introduces a secondary capacitance effect. Namely, the collector to base capacitances of follower transistors Q4 and Q7. To effectively reduce the values of these unwanted capacitances, the reactive charging and discharging currents supplied to these capacitances are reduced. This feature is provided by the two positive feedback regulators 50 and 60 which maintain the collector to emitter voltages for the follower transistors at constant values.

As an example, if the output voltage of amplifier 20 increases, then the emitter voltage of the follower transistor Q4 will increase but the Zener diode CR3 and the regulator transistor Q6 will increase the collector voltage of the follower transistor Q4. Similarly, for a decreasing output voltage of amplifier 20, the emitter voltage of follower transistor Q4 will decrease and the Zener diode CR3 and the regulator transistor Q6 will cause a decrease in the collector voltage of the follower transistor Q4. Illustratively, for a Zener voltage of 10 Volts, the collector emitter voltage of transistor Q4 will equal the Zener voltage minus the base-emitter junction voltages (Vbe) of transistors Q5 and Q6. For the assumed Zener voltage of 10 volts, the resultant collector-emitter voltage of transistor Q4 will thus be about equal to 8.8 Volts (assuming a Vbe value of 0.6 volts).

Thus, whether the follower input voltage is increasing or decreasing, the voltage across the follower transistor from the collector to the emitter is constant. As the input signal goes through points of inflection, the base voltage will vary by a few hundred millivolts relative to the emitter as the follower transistor is biased on and off (push-pull operation). However, it has been found that the base emitter voltage variations are relatively minor as compared with the regulated collector emitter voltage (e.g., a Zener voltage of 10 volts or so). As a result one may consider that the collector to base voltage variations are "substantially" constant and so there can be little charging and discharging of the collector to base capacitance under dynamic signal conditions. Since such reactive currents are suppressed, in accordance with the invention, the effective collector to base capacitances are reduced for the follower amplifier.

As described above, the feedback for regulating the collector emitter voltages for the follower transistors is nearly one hundred percent. It can never exactly equal one hundred percent because the gains of transistors Q5 and Q6, for example, can not equal unity since that would require infinite current gains. In other words, transistors Q5 and Q6 are both connected as emitter followers and the gain of an emitter follower may be very close to unity but never equal to unity. Accordingly, even though the feedback is positive, the circuit is stable. Lesser amounts of feedback, e.g., 50% may be used if desired in a given application. It will be noted that the actual Zener voltage is not a critical parameter of the circuit. The Zener by-pass capacitor (C3 or C4) provides a desirable reduction in AC impedance of the voltage regulator to further facilitate wideband operation.

Figure 2:
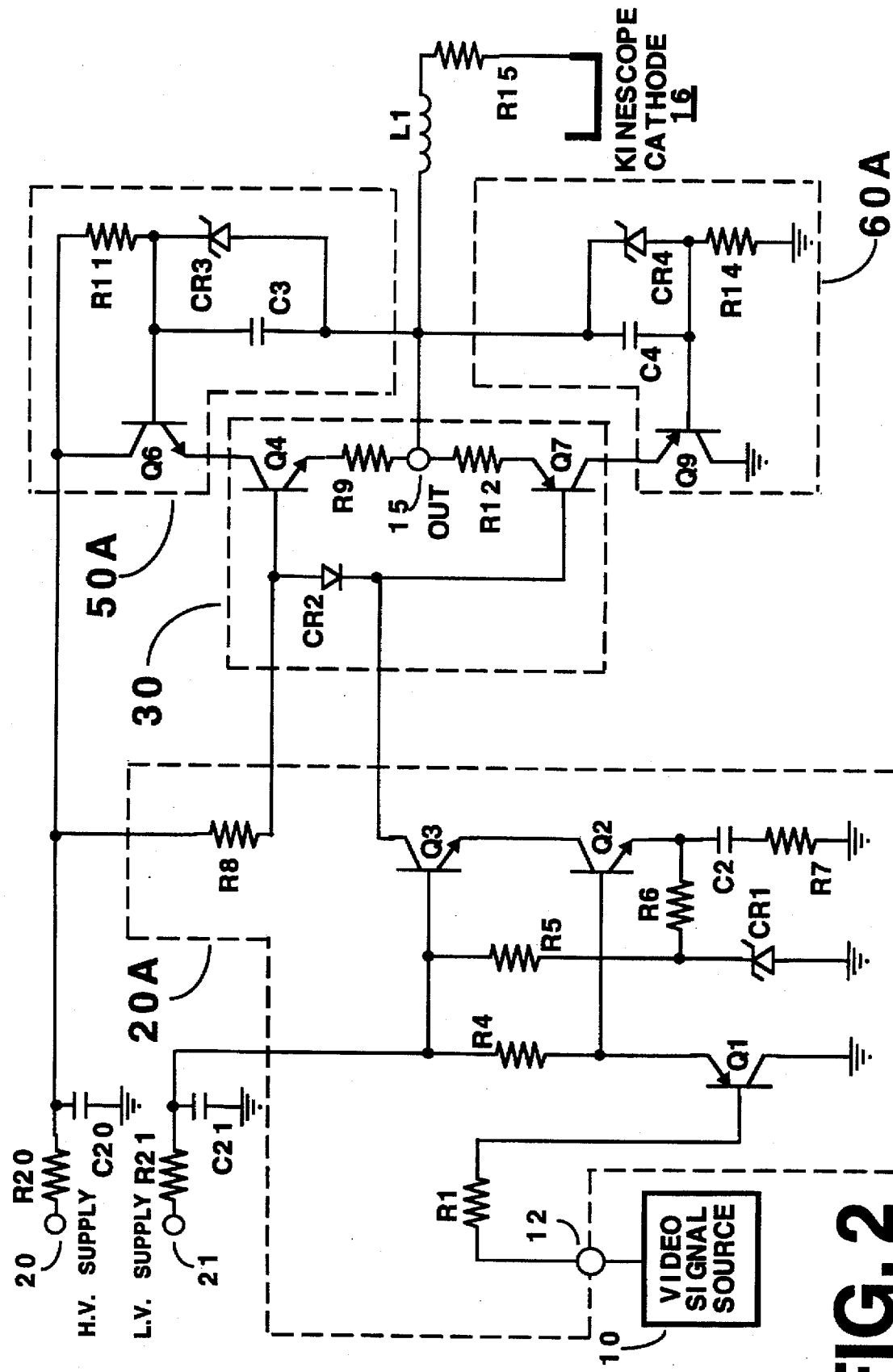
FIG. 2 illustrates a modification of the apparatus of FIG. 1 in which a high voltage driver portion is simplified for feed forward operation and in which positive offset feedback circuitry is simplified for reduction in the active device count.

The example of FIG. 1 may be modified as shown in FIG. 2. In this example feedback control of the gain of the cascode amplifier has been replaced by feedforward control and the AKB sense amplifier 40 has been deleted. Additionally, the voltage regulators 50 and 60 have been simplified.

In more detail, in the high voltage cascode amplifier 20 of FIG. 2 the feedback resistor R2 has been removed as well as the input peaking components resistor R1 and capacitor C1.

The gain, as thus modified, is determined by the load resistor R8 and the emitter impedance of input transistor Q2 (i.e., emitter resistor R6 and the peaking network comprising capacitor C2 and resistor R7. Aside from these modifications, operation is otherwise the same as in the example of FIG. 1.

Omission of the AKB sense amplifier 40, as previously explained, requires a source of relatively low potential for the collector of the positive feedback voltage regulator transistor Q9. The collector could be connected any suitable potential near ground. Here it is connected directly to ground.

Simplification of the positive feedback voltage regulator circuits 50A and 50B comprises removing transistors Q5 and Q8 and removing resistors R10 and R13. In the previous examples, these elements providing coupling of the emitters of the follower transistors to the respective threshold conduction devices and capacitors. In this example, the emitter of follower transistor Q4 is coupled to capacitor C3 and Zener diode CR3 by connecting these elements directly to the output terminal 15. The same is done for capacitor C4 and Zener diode CR4.

In operation, resistor R11 supplies current from the high voltage supply 20 through Zener diode CR3 to the output terminal 15. This establishes a regulated voltage at the base of regulator transistor Q6 that equals the emitter voltage of transistor Q4 less the drop across resistor R9 plus the Zener voltage of diode CR3. Resistor R9 is provided primarily to provide protection against simultaneous conduction of transistors Q4 and Q7 and so may be of a relatively small value (e.g., 30 Ohms or so). Accordingly, the voltage drop across resistor R9 is negligible and the transistor Q4 operates at a substantially constant collector emitter voltage. Operation of the modified feedback regulator 60A is the same as for 50A, except for the transistor polarities and directions of current flow.

Figure 3:
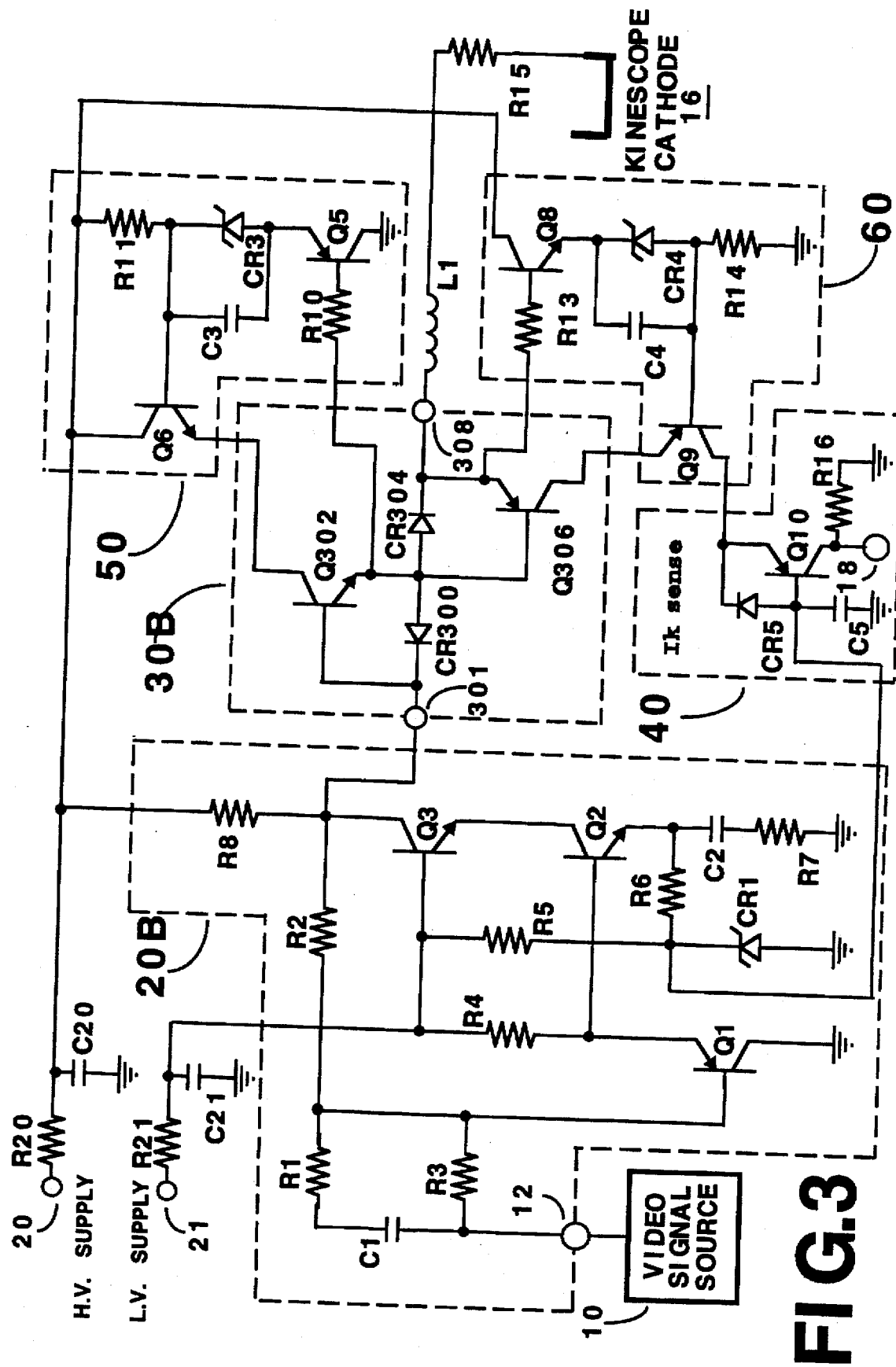
FIG. 3 illustrates a modification of the apparatus of FIG. 1 in which complementary push-pull emitter follower buffer amplifiers of the parallel type are replaced by complementary push-pull emitter follower buffer amplifiers of a series type.

FIG. 3 illustrates a modification of the example of FIG. 1 in which the "parallel" form of complementary push-pull emitter follower 30 is replaced by a "series" form of complementary push-pull emitter follower 30B. The modified follower comprises an NPN transistor Q302 having the base-emitter path thereof coupled in series with that of a PNP transistor Q306 between an input terminal 301 and an output terminal 308. Respective diodes CR300 and CR304 are coupled across the base-emitter junctions of the transistors Q302 and Q306 and poled opposite to the poling of the associated junction. Accordingly, diode CR300 is conductive when transistor Q302 is biased off and vice versa. Similarly, diode CR304 is rendered conductive which transistor Q306 is biased off.

The collector to emitter voltage of transistor Q302 is regulated at about the value of the Zener voltage of diode CR3 by connecting resistor R10 to the emitter of follower transistor Q302 to sense the emitter voltage and connecting the emitter of the voltage regulator transistor Q6 to the collector of follower transistor Q302. This provides positive feedback for regulating the collector voltage of transistor Q302 at a value offset from the emitter voltage and proportional to the Zener voltage of diode CR3.

Similarly, the collector to emitter voltage of transistor Q306 is regulated at about the value of the Zener voltage of diode CR4 by connecting resistor R13 to the emitter of follower transistor Q306 to sense the emitter voltage and connecting the emitter of the voltage regulator transistor Q9 to the collector of follower transistor Q306. This provides positive feedback for regulating the collector voltage of transistor Q302 at a value offset from the emitter voltage and proportional to the Zener voltage of diode CR4.

Since diode CR2 is not needed in the modified circuit, the load resistor R8 for the cascode amplifier 20 is connected directly to the collector of the cascode output transistor Q3 and this point is connected directly to the input 301 of follower 30B. In operation, an increasing video signal voltage at input 301 will forward bias transistor Q302 to supply drive current via diode CR304 to the kinescope cathode 16 and regulator 50 will maintain the collector emitter voltage of transistor Q302 constant. A decreasing video signal voltage at the input 301 will forward bias transistor Q306 to withdraw drive current via diode CR300 from the kinescope cathode and regulator 60 will maintain the collector emitter voltage of transistor Q306 at a substantially constant value. For purposes of AKB sensing the collector current of the regulator transistor Q9 is applied to the sense amplifier circuit 40 the operation of which is as previously described.

Figure 4:
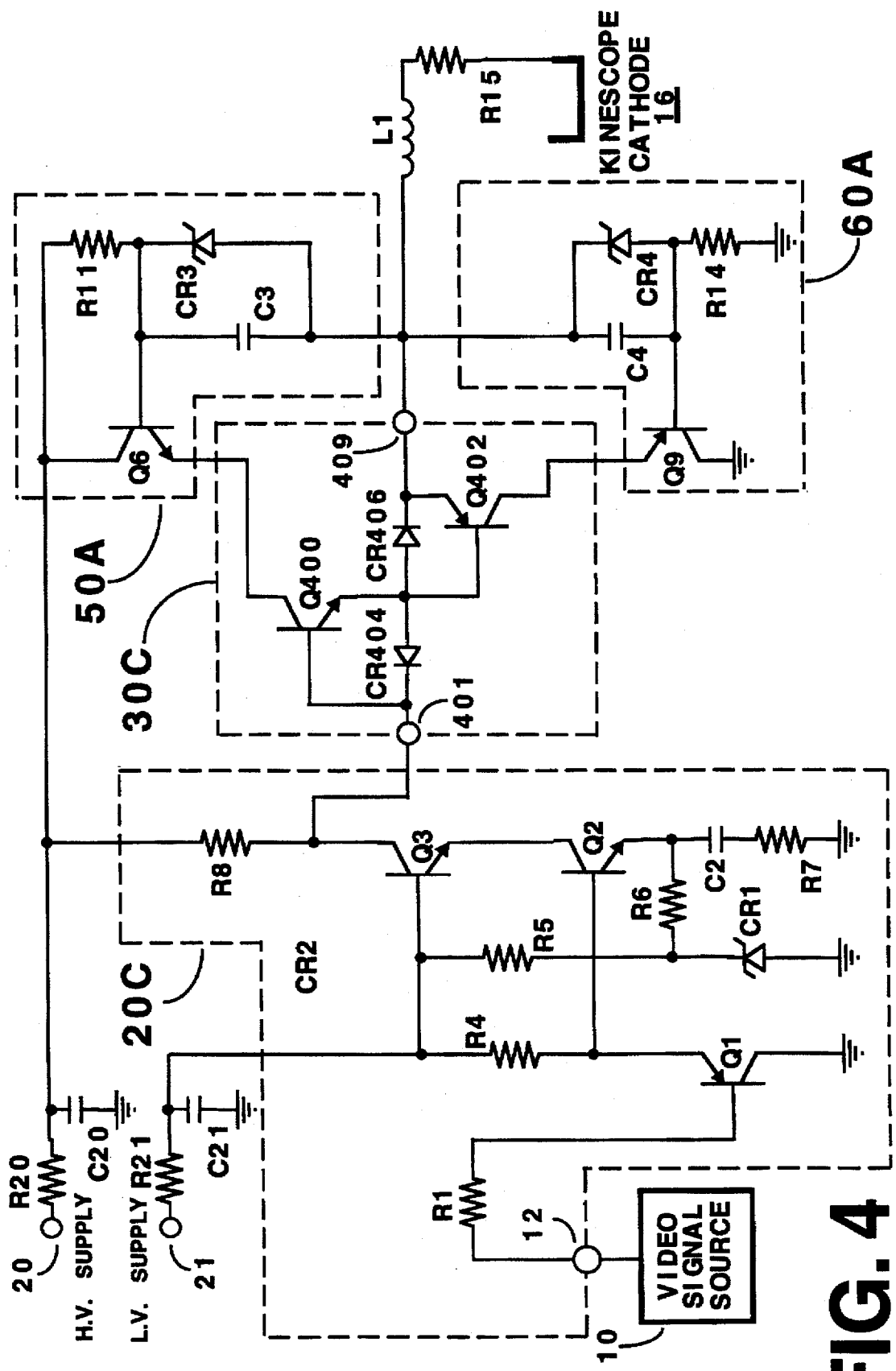
FIG. 4 illustrates a modification of the apparatus of FIG. 2 in which complementary push-pull emitter follower buffer amplifiers of the series type are replaced by complementary push-pull emitter follower buffer amplifiers of the series type.

FIG. 4 illustrates a modification of the example of FIG. 1 in which the "parallel" form of complementary push-pull emitter follower 30 is replaced by a "series" form of complementary push-pull emitter follower 30C. The modified follower comprises an NPN transistor Q400 having the base-emitter path thereof coupled in series with that of a PNP transistor Q402 between an input terminal 401 and an output terminal 409. Respective diodes CR404 and CR406 are coupled across the base-emitter junctions of the transistors Q400 and Q402 and poled opposite to the poling of the associated junction. Accordingly, diode CR404 is conductive when transistor Q400 is biased off and vice versa. Similarly, diode CR406 is rendered conductive which transistor Q402 is biased off.

The collector to emitter voltage of transistor Q400 is regulated at about the value of the Zener voltage of diode CR3 by connecting the emitter of transistor Q6 to the collector of transistor Q400 and coupling the emitter of transistor Q6 to the output 409 via capacitor C3 and Zener diode CR3. This provides positive feedback for regulating the collector voltage of transistor Q400 at a value offset from the emitter voltage and proportional to the Zener voltage of diode CR3.

Similarly, the collector to emitter voltage of transistor Q402 is regulated at about the value of the Zener voltage of diode CR4 by connecting the emitter of regulator transistor Q9 to the collector of transistor Q402 and coupling the base of transistor Q9 to the output terminal 409 via capacitor C4 and Zener diode CR4. This provides positive feedback for regulating the collector voltage of transistor Q302 at a value offset from the emitter voltage and proportional to the Zener voltage of diode CR4.

Since diode CR2 is not needed in the modified circuit of FIG. 4, the load resistor R8 for the cascode amplifier 20 is connected directly to the collector of the cascode output transistor Q3 and this point is connected directly to the input 401 of follower 30C. In operation, an increasing video signal voltage at input 401 will forward bias transistor Q400 to supply drive current via diode CR406 to the kinescope cathode 16 and regulator 50 will maintain the collector emitter voltage of transistor Q400 constant. A decreasing video signal voltage at the input 401 will forward bias transistor Q402 to withdraw drive current via diode CR404 from the kinescope cathode and regulator 60 will maintain the collector emitter voltage of transistor Q402 at a substantially constant value. Since AKB sensing is not required, the collector of the voltage regulator transistor Q9 is coupled of a source of relatively low voltage (ground).

Figure 5:
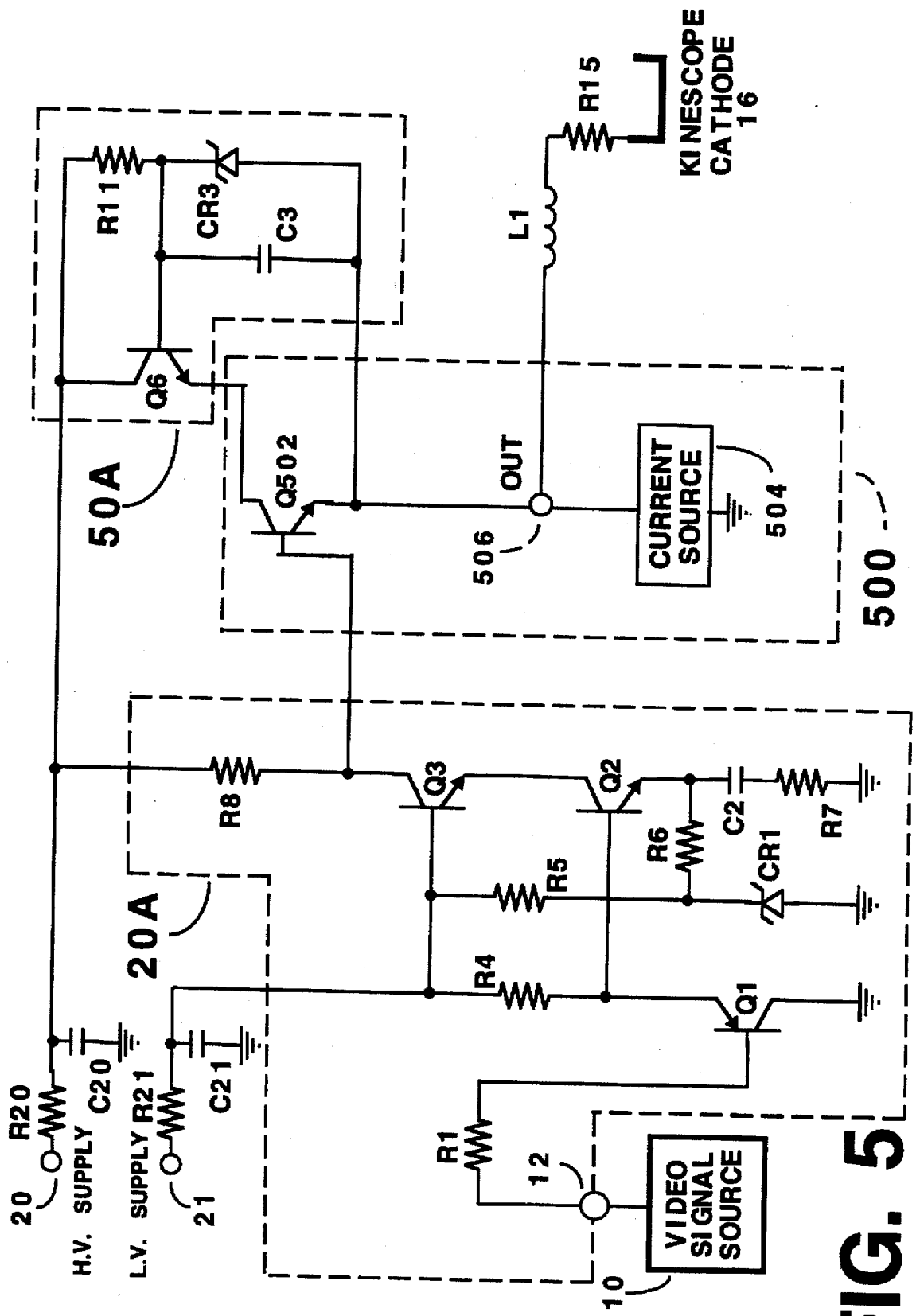
FIG. 5 is a circuit diagram, partially in block form illustrating a modification of the example of FIG. 2 for single-ended kinescope driver applications.

FIG. 5 illustrates a modification of the example of FIG. 2 for providing single-ended voltage follower operation. The term "voltage" follower, as used herein refers to emitter followers (which employ bipolar transistors) and to source followers (which employ field effect transistors). In this example of the invention the voltage follower operates in a Class A mode in which the follower transistor is conductive all the time. This eliminates crossover distortion which may occur in complementary followers in which the transistors operate in a Class B mode with limited conduction. On the other hand, class-B or push-pull operation is preferred from a power dissipation standpoint as the efficiency is much higher than with single ended followers.

As a brief overview, in this example of the invention a video amplifier (20A) is coupled to a kinescope cathode electrode 16 via a voltage follower 500. The voltage follower comprises a transistor having a conduction path and a control electrode for controlling the conduction of the path. In this case the voltage follower is an emitter follower and the follower transistor is a bipolar transistor Q502. The control electrode (e.g., the base of transistor Q502) is coupled to receive a video signal from the video amplifier. A first end of said conduction path (e.g., the emitter of Q502) is coupled to a point of reference potential (here, ground) via a current source 504 and is coupled to the kinescope cathode 16. The second end (i.e., the emitter of Q502) of the conduction path being coupled to a source of supply voltage (20). A feedback circuit 50A is coupled to the first end of the conduction path for applying a positive feedback voltage to the second end of the conduction path of the voltage follower transistor (Q502) for maintaining a substantially constant voltage across the conduction path that is independent of variations in the video signal applied to said control electrode.

In more detail, in FIG. 5 the output of cascode amplifier 20A is coupled to the kinescope cathode 16 via a single ended emitter follower amplifier 500 comprising an emitter follower transistor Q502 connected at the base electrode thereof to the output (collector) of transistor Q3 in the cascode amplifier 20A. In this case the collector load resistor R8 is connected directly to the collector of the output transistor Q3. The emitter of transistor Q502 is coupled to an output terminal 506 which is coupled to ground via a current source 504 that provides a constant current drive to the output terminal 506. The cathode electrode 16 is coupled to the output terminal 506 via the kinescope arc arresting network comprising the series connection of resistor R15 and inductor L1.

For regulating the collector to emitter voltage of the emitter follower transistor at a constant value, the emitter is connected to capacitor C3 and Zener diode CR3 of the positive feedback voltage regulator circuit 50A. The output of this regulator is the emitter of regulator transistor Q6 which is coupled to the collector electrode of the emitter follower transistor Q502.

Operation of the emitter follower is similar to operation of the corresponding transistors previously described except with regard to the efficiency and cross over effects discussed above and the method of providing a pull down current. Specifically, for decreasing values of the video signal the reduction of the cathode voltage is provided by the current source 504. While this source may comprise a passive element such as a resistor, an active device may be preferable in certain applications, e.g., where a faster negative going slew rate is desired at low output voltage levels. A constant current source, such as a suitable biased bipolar or field effect transistor is suitable for this purpose.

To reiterate the overall operation, when the amplified video signal provided by amplifier 20A is increasing in voltage the emitter voltage of transistor 502 will increase also thus boosting the base potential of the feedback regulator transistor Q6 and so maintaining the collector to emitter voltage of the emitter follower transistor constant. Since this voltage does not change significantly, there is no charging of the collector to base capacitance of transistor Q502 and so the effective capacitance presented to the output of amplifier 20A is reduced over that of a conventional emitter follower amplifier. Conversely as the base voltage falls, so does the emitter voltage and transistor Q6, being offset from the emitter voltage by the Zener voltage of diode CR3, decreases the collector voltage of the follower transistor Q502 so as to maintain a constant collector to emitter voltage. In this latter case there is no active pull-down of the video output voltage but this function is provided by the current source 504.

Figure 6:
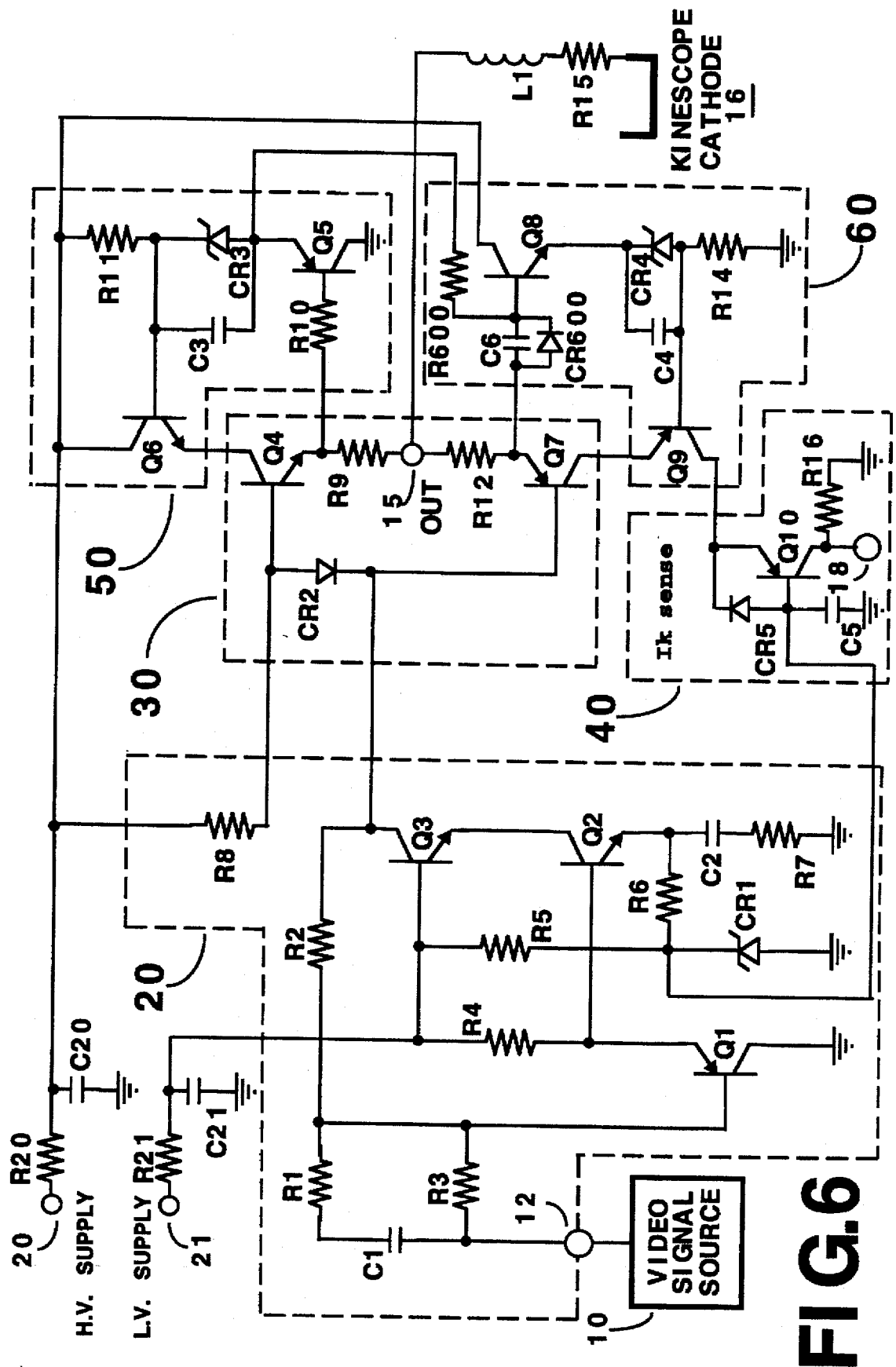
FIG. 6 illustrates a further modification of the example of FIG. 1.

FIG. 6 illustrates a modification of the example of FIG. 1 with regard to the manner of providing base drive current for transistor Q8. Specifically, in FIG. 1 the base of transistor Q8 was connected to the emitter of the follower transistor Q7 via a resistor whereas in FIG. 6 the base of transistor Q8 is coupled via a diode CR600 and a capacitor C6 to the emitter of transistor Q8 and is coupled via a resistor R600 to the emitter of transistor Q5.

The purpose of the foregoing changes is to reduce potential cathode current (Ik) sensing errors by DC biasing the base of transistor Q8 from the emitter of transistor Q5. This eliminates the DC base current demand for transistor Q8 from the emitter of transistor Q7 which conducts the cathode current Ik. The added capacitor C6 provides AC coupling of the emitter of transistor Q7 to the base of transistor Q8 and so the high frequency operation is the same as in the previous example. The added diode CR600 provides a correction for video signal conditions involving high frequencies and high duty cycles. Specifically, this diode provides a DC path around the AC coupling capacitor for high duty cycle, high frequency signal conditions to prevent a reduction in base bias for transistor Q8 under high duty cycle, high frequencie, signal conditions. Briefly, diode CR600 prevents capacitor C6 from developing a significant average charge that would otherwise tend to reduce the base bias of transistor Q8 for video signals Of high frequency and high duty cycle.

In more detail, it has been discovered that trader certain conditions in the example of FIG. 1 the current demand due to the base current of transistor Q8 may introduce an undesired error in measurement of the cathode current Ik by the sense amplifier 40. At the point where Ik is measured for AKB purposes, the cathode is near cutoff (a high voltage level) and thus the current through the base circuit of transistor Q8 is relatively high and so may cause a significant error in the cathode current Ik measurement. The modifications described above ensure that for DC and low frequencies the base current of transistor Q8 comes from the emitter of transistor Q5 thus reducing the Ik measurement error. However, for optimum high frequency response during active video intervals it is not desirable just to drive the base of transistor Q8 just from the emitter of transistor Q5. For such a case more drive is required, that is, for active video signals (i.e., displayed video as compared with video measurement levels in AKB operation) transistor Q8 should receive the high current push-pull and reduced phase shift benefits that AC coupling from the emitter of transistor Q7 provides. The function of the added diode, CR600, in the base drive circuit for transistor Q8 is to provide for those occasions when the driver is subjected to high duty cycle, large amplitude high frequency signals which would otherwise result in transistor Q8 shifting is bias point. For such transient conditions, the added diode CR600 provides a by-pass around the AC coupling capacitor C6.

It will be apparent that various other changes may be made to the examples of the invention herein shown and described. For example the cascode amplifier 20 may be provided with an active collector load rather than the passive (resistor) load shown. A suitable active load would be a transistor biased for operation as a current source. Another modification to the cascode amplifier load impedance would be to couple an inductor in series with resistor R8. Another alternative would be to couple a small capacitance from the output of the push-pull amplifier to a "center tap" on load resistor R8 to optimize the overall performance. To facilite the center tap, resistor R8 may be fromed from two smaller valued resistor connected in series with the common connection there used for the tap point.

What is claimed is:

1. Kinescope driver apparatus, comprising:

a video amplifier having an output coupled to a kinescope cathode electrode via a voltage follower;

said voltage follower comprising a transistor having a conduction path and a control electrode for controlling the conduction of the path, said control electrode being coupled to receive a video signal from said video amplifier, a first end of said conduction path being coupled to a point of reference potential via a current source and being coupled to said kinescope cathode, said second end of said conduction path being coupled to a source of supply voltage; and a feedback circuit coupled to said first end of said conduction path for applying a positive feedback voltage to said second end of said conduction path of said voltage follower transistor for maintaining a substantially constant voltage across said conduction path that is independent of variations in said video signal applied to said control electrode.

2. Apparatus as in claim 1, wherein said feedback circuit comprises:

a threshold conduction device having an anode coupled to one end of the conduction path of said follower transistor and having a cathode coupled to another end of the conduction path of said follower transistor.

3. Apparatus as in claim 1, wherein said feedback circuit comprises:

means for applying a first voltage to said second end of said conduction path via a first voltage regulator transistor having a control electrode that is DC coupled to said first end of said conduction path via a threshold conduction device.

4. Apparatus as in claim 1, wherein said feedback circuit comprises:

a threshold conduction device having first and second electrodes;

a unity gain amplifier coupled between one of said electrodes of said threshold conduction device and the second end of the conduction path of said follower transistor; and a circuit path containing no active device for coupling the other of said electrodes of said threshold conduction device to the first end of the conduction path of said follower transistor.

5. Apparatus as in claim 1, wherein said feedback circuit comprises:

a threshold conduction device having first and second electrodes;

a first unity gain amplifier coupled between said first end of said conduction path of said follower transistor and one of said electrodes of said threshold conduction device; and a second unity gain amplifier coupled between the other of said electrodes of threshold conduction device and said second end of the conduction path of said follower transistor.

6. Kinescope driver apparatus, comprising:

a video amplifier having an output coupled to a kinescope cathode electrode via an emitter follower;

said emitter follower comprising a follower transistor having emitter, base and collector electrodes, said base electrode being coupled to receive a video signal from said video amplifier, said emitter electrode coupled to a point of reference potential via a current source and being coupled to supply a video output signal to said kinescope cathode, said collector electrode being coupled to receive a source of supply voltage; and a feedback circuit responsive to said video output signal for applying a positive feedback voltage to said collector electrode of said follower transistor for maintaining a substantially constant collector emitter voltage that is independent of variations in said video signal.

7. Apparatus as in claim 6, wherein said feedback circuit comprises:

a Zener diode having an anode coupled to said emitter electrode of said follower transistor and having a cathode coupled to said collector electrode of said follower transistor for maintaining said substantially constant collector emitter voltage at a value substantially equal the a threshold voltage characteristic of said Zener diode.

8. Apparatus as in claim 6, wherein said feedback circuit comprises:

means for applying a first voltage to said second end of said conduction path via a first voltage regulator transistor having a control electrode that is DC coupled to said first end of said conduction path via a threshold conduction device.

9. Apparatus as in claim 6, wherein said feedback circuit comprises:

a threshold conduction device having first and second electrodes;

a unity gain amplifier coupled between one of said electrodes of said threshold conduction device and the collector electrode of said follower transistor; and a direct current conductive circuit path, containing no active semiconductor device, for coupling the other of said electrodes of said threshold conduction device to the emitter of said follower transistor.

10. Apparatus as in claim 6, wherein said feedback circuit comprises:

a threshold conduction device having first and second electrodes;

a first unity gain amplifier coupled between one of said electrodes of said threshold conduction device and the collector electrode of said follower transistor; and a second unity gain amplifier coupled between the emitter of said follower transistor and the other of said electrodes of said threshold conduction device.

11. Apparatus as in claim 6 wherein said follower transistor comprises a first NPN transistor and wherein said feedback circuit comprises:

a second NPN transistor having a collector connected to a positive supply voltage terminal, having an emitter connected to the collector of said follower transistor and having a base electrode coupled via a resistor to said positive supply voltage terminal and coupled via a threshold conduction diode to the emitter electrode of said follower transistor.

12. Apparatus as in claim 6 wherein said follower transistor comprises a first NPN transistor and wherein said feedback circuit comprises:

a PNP transistor having a base coupled to the emitter of said follower transistor, having a collector coupled to a source of reference potential and having an emitter coupled to an anode of a threshold conduction device;

a second NPN transistor having a base connected to a cathode of said threshold conduction device, having a collector connected to a source of supply voltage and having an emitter coupled to the collector of said follower transistor; and a current source coupled to the cathode of said threshold conduction device.

13. Kinescope driver apparatus, comprising:

circuit means coupling an output of a video amplifier to a kinescope cathode via a push-pull complementary emitter follower amplifier; and a feedback circuit for applying a respective positive feedback voltage to respective collector electrodes of first and second output transistors of said push-pull emitter follower amplifier for maintaining a substantially constant collector-emitter voltage for said output transistors.

14. Apparatus as in claim 13, wherein said feedback circuit comprises:

means for sensing an emitter voltage of a said first output transistor of said follower amplifier;

means for regulating the collector voltage of said first output transistor at a constant voltage relative to the sensed emitter voltage thereof;

means for sensing the emitter voltage of said second output transistor; and means for regulating the collector voltage of said second output transistor at a constant voltage relative to the sensed emitter voltage thereof.

15. Apparatus as in claim 13 wherein said feedback circuit comprises:

means for sensing an output voltage of said emitter follower amplifier;

means for regulating the collector voltage of said first output transistor at a constant voltage relative to the sensed output voltage of said emitter follower amplifier; and means for regulating the collector voltage of said second output transistor at a constant voltage relative to the sensed output voltage of said emitter follower amplifier.

16. Apparatus as in claim 13 wherein said feedback circuit comprises:

means for applying a first voltage to a collector of said first output transistor via a first voltage regulator transistor having a base electrode that is DC coupled to an emitter of said first output transistor via a first Zener diode; and means for applying a second voltage to a collector of said second output transistor via a second voltage regulator transistor having a base electrode that is DC coupled to an emitter of said second output transistor via a second Zener diode.

17. Apparatus as in claim 13 wherein said first and second output transistors have respective base electrodes coupled to said output of said video amplifier and having respective emitter electrodes coupled to said cathode electrode and wherein said feedback circuit comprises:

a first PNP transistor having a base coupled to the emitter of said first output transistor, having a collector coupled to a source of reference potential and having an emitter coupled via a first threshold conduction device to the base of a first NPN transistor connected at the collector thereof to a source of supply voltage and connected at the emitter thereof to the collector of said first output transistor; and a second NPN transistor having a base coupled to the emitter of said second output transistor, having a collector coupled to said source of supply voltage and having an emitter coupled via a second threshold conduction device to the base of a second PNP transistor connected at the collector thereof to a source of reference voltage and connected at the emitter thereof to the collector of said second output transistor.

18. Kinescope driver apparatus, comprising:

circuit means coupling an output of a video amplifier to a kinescope cathode via a push-pull complementary emitter follower amplifier;

a feedback circuit responsive to an emitter voltage of a first transistor of said follower amplifier for regulating a collector emitter voltage of said first transistor at a substantially contant value; and a second feedback circuit, responsive jointly to said emitter voltage of said first transistor of said follower amplifier and to an emitter voltage of a second transistor of said follower amplifier for regulating a collector emitter voltage of said second transistor at a substantially constant value.

19. Kinescope driver apparatus, as recited in claim 18, wherein said second feedback circuit is DC coupled to said first feedback circuit and AC coupled to said emitter of said second transistor.

20. Kinescope driver apparatus, as recited in claim 18 wherein said said second feedback circuit is DC coupled to said first feedback circuit and is both AC coupled and coupled via a diode to said emitter of said second transistor.

* * * * *